United States Patent
Bhattacharya et al.

(10) Patent No.: US 7,432,762 B2
(45) Date of Patent: Oct. 7, 2008

(54) CIRCUIT HAVING ENHANCED INPUT SIGNAL RANGE

(75) Inventors: Dipankar Bhattacharya, Macungie, PA (US); Makeshwar Kothandaraman, Whitehall, PA (US); John C. Kriz, Palmerton, PA (US); Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 178 days.

(21) Appl. No.: 11/393,171

(22) Filed: Mar. 30, 2006

(65) Prior Publication Data

US 2007/0229157 A1    Oct. 4, 2007

(51) Int. Cl.
*H03F 3/45* (2006.01)
*G06G 7/12* (2006.01)

(52) U.S. Cl. ........................ 330/253; 327/563
(58) Field of Classification Search ............... None
See application file for complete search history.

(56) References Cited

U.S. PATENT DOCUMENTS

| | | | | |
|---|---|---|---|---|
| 4,213,098 A | * | 7/1980 | Tsividis ............... | 330/253 |
| 5,714,906 A | * | 2/1998 | Motamed et al. ...... | 327/563 |
| 5,909,146 A | * | 6/1999 | Okada ................. | 330/255 |
| 6,166,978 A | * | 12/2000 | Goto ................... | 365/207 |
| 6,433,637 B1 | * | 8/2002 | Sauer .................. | 330/255 |
| 7,030,695 B2 | * | 4/2006 | May et al. ............ | 330/253 |
| 7,116,171 B2 | * | 10/2006 | Maekawa et al. ..... | 330/253 |
| 7,154,789 B2 | * | 12/2006 | Kim et al. ............ | 365/189.09 |
| 2007/0057724 A1 | * | 3/2007 | Koizumi et al. ...... | 330/253 |

* cited by examiner

*Primary Examiner*—Robert J. Pascal
*Assistant Examiner*—Krista M Flanagan

(57) ABSTRACT

A circuit having an enhanced input signal range includes a differential amplifier operative to receive at least first and second signals and to generate a difference signal at an output thereof which is a function of the difference between the first and second signals. The differential amplifier includes an input stage having at least first and second transistors having a first threshold voltage associated therewith and being operative to receive the first and second signals, respectively, and a load including at least third and fourth transistors having a second threshold voltage associated therewith, the first threshold voltage being greater than the second threshold voltage. The circuit further includes an output stage coupled to the differential amplifier and operative to receive the difference signal and to generate an output signal of the circuit that is indicative of the difference signal and is referenced to the supply voltage of the circuit.

20 Claims, 6 Drawing Sheets

CIRCUIT HAVING ENHANCED INPUT SIGNAL RANGE

FIELD OF THE INVENTION

The present invention relates generally to electronic circuits, and more particularly relates to techniques for increasing input signal range in a circuit.

BACKGROUND OF THE INVENTION

Comparators are well known in the art. A comparator is a circuit which compares one input signal with at least another input signal and outputs a binary signal based on the result of the comparison. In the case of an analog comparator, the two or more input signals to be compared are generally analog in nature. What is meant here by an analog signal is one that can have one of a continuum of amplitude values at any given point in time. In many applications, it is desirable to provide a binary output signal indicating when an input signal is above or below a predefined reference level. In this scenario, a substantially fixed reference voltage is applied to one of the inputs of the comparator, and the other input of the comparator receives the input signal to be compared. The output signal generated by the comparator will be a binary signal representing whether the input signal is greater than or less than the reference voltage level.

Certain input/output (IO) interface applications, including, for example, gunning transistor logic (GTL), high-speed transceiver logic (HSTL), and series stub terminated logic (SSTL), require comparator circuits which are compatible with a wide range of input voltages (e.g., about 1.0 volt to about 3.3 volts). In such comparator circuits, it is also generally desirable to have a substantially low power dissipation and operate at high data rates (e.g., greater than about 1.0 gigabits per second) over a desired range of process, voltage and/or temperature (PVT) variations to which the comparator circuits may be subjected.

Conventionally, either a comparator circuit using all IO transistor devices and running off an IO supply voltage (e.g., 3.3 volts), or a comparator circuit employing all core transistor devices and running off a core supply voltage (e.g., 1.0 volt) has been used in IO interface applications. In this instance, IO devices have a substantially higher threshold voltage associated therewith compared to core devices. A comparator circuit employing all IO devices, however, typically has high power dissipation and lacks the ability to accept low input signal swings. This limits the applicability of such circuits to signaling levels that are typically greater than about 1.2 volts. On the other hand, a comparator circuit employing all core devices cannot accept high input signal swings without undesirably impacting reliability.

Accordingly, there exists a need for an improved comparator circuit for interfacing with a wide range of input signal levels and which does not suffer from one or more of the problems exhibited by conventional comparator circuits.

SUMMARY OF THE INVENTION

The present invention meets the above-noted need by providing, in an illustrative embodiment thereof, an improved comparator circuit configured to accept a wide range of input signal levels and therefore suited for operation with a variety of IO interface standards, including, but not limited to, HSTL, SSTL and GTL. Moreover, the improved comparator circuit advantageously increases the operable range of input signal levels without significantly increasing power consumption in the comparator circuit and without the addition of voltage level translation circuitry which can undesirably introduce significant delay into the comparator circuit.

In accordance with one aspect of the invention, a circuit having an enhanced input signal range includes a differential amplifier operative to receive at least first and second signals and to amplify a difference between the first and second signals. The differential amplifier generates a difference signal at an output thereof which is a function of the difference between the first and second signals. The differential amplifier includes an input stage having at least first and second transistors operative to receive the first and second signals, respectively, each of the first and second transistors having a first threshold voltage associated therewith, and a load including at least third and fourth transistors having a second threshold voltage associated therewith, the first threshold voltage being greater than the second threshold voltage. The circuit further includes an output stage coupled to the differential amplifier and being operative to receive the difference signal and to generate an output signal of the circuit, the output signal being indicative of the difference signal and being referenced to the first voltage. The circuit is configured to accept the first and second signals having a voltage swing which is potentially greater than a supply voltage of the circuit.

These and other features and advantages of the present invention will become apparent from the following detailed description of illustrative embodiments thereof, which is to be read in connection with the accompanying drawings.

DETAILED DESCRIPTION OF THE INVENTION

Figure 1:
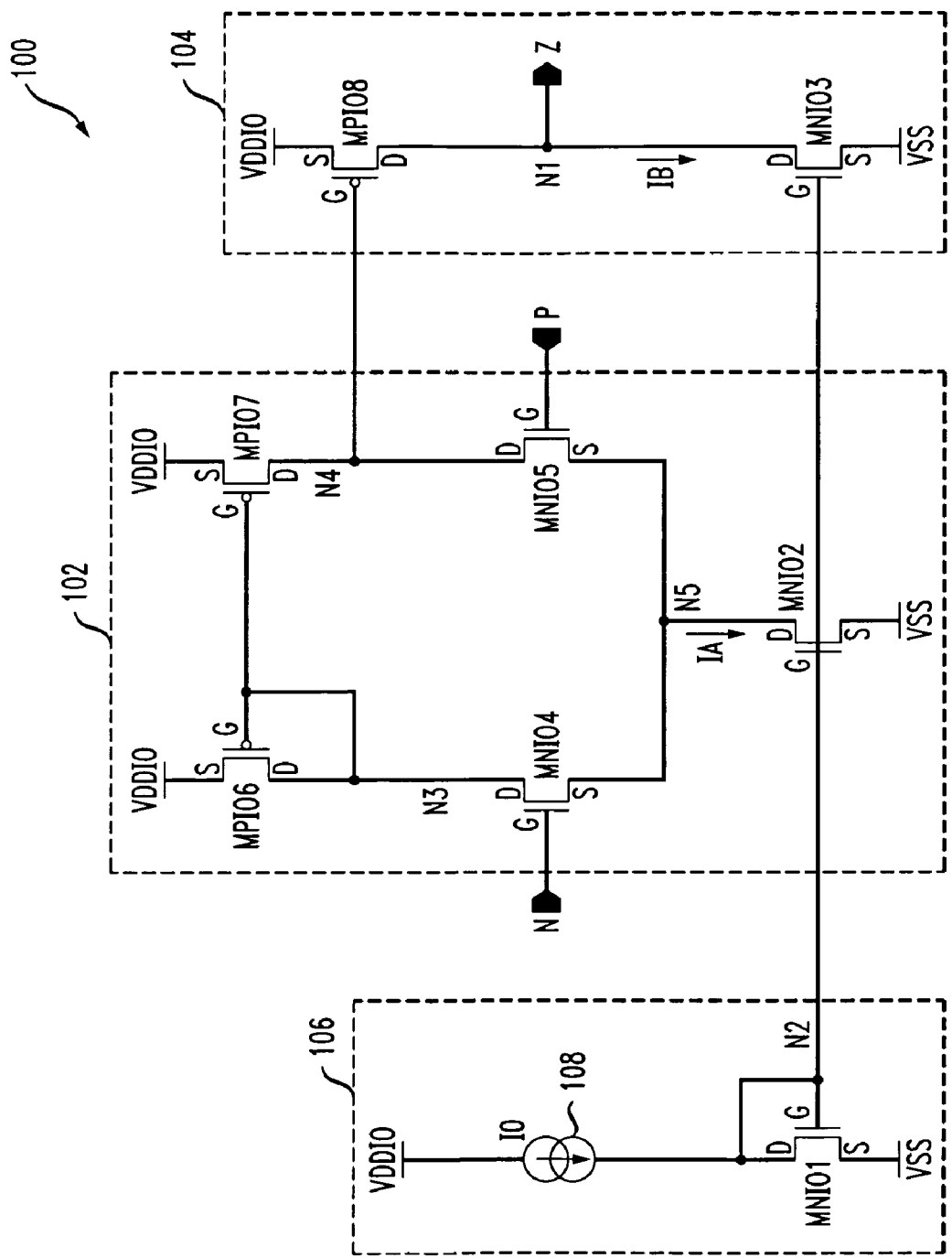
FIG. 1 is a schematic diagram depicting an illustrative high-voltage comparator circuit.

The present invention will be described herein in the context of illustrative comparator circuits. It should be understood, however, that the present invention is not limited to these or any particular comparator circuit arrangements. Rather, the invention is more generally applicable to techniques for advantageously enhancing the range of input signal swing in a circuit without significantly increasing power consumption in the circuit. Furthermore, although implementations of the present invention are described herein with specific reference to n-channel metal-oxide semiconductor (NMOS) transistor devices and p-channel metal-oxide semiconductor (PMOS) transistor devices, as may be formed using a complementary metal-oxide semiconductor (CMOS) fabrication process, it is to be appreciated that the invention is not limited to such transistor devices and/or to such a fabrication process, and that other suitable devices, such as, for example, bipolar junction transistors, etc., and/or fabrication processes (e.g., bipolar, BiCMOS, etc.), may be similarly employed, with or without modification to the circuit shown, as will be understood by those skilled in the art.

Many modern electronic circuits comprise both low-voltage core logic circuitry and higher voltage IO circuitry. The core logic circuitry typically operates with a lower supply voltage, such as VDDCORE (e.g., about 1.0 volt), primarily to reduce power dissipation and improve speed performance therein, whereas the IO circuitry typically operates at a higher supply voltage, such as VDDIO (e.g., 3.3 volts), primarily to maximize off-chip noise margins and to comply with popular IO interface standards. The core logic circuitry typically employs transistor devices, which may be referred to herein as "low-voltage" devices, having thinner gate oxides associated therewith. The IO circuitry, in comparison, typically employs transistor devices, which may be referred to herein as "high-voltage" devices, having thicker gate oxides associated therewith. Traditional mixed signal integrated circuit fabrication processes generally offer both high-voltage and low-voltage transistor devices. The high-voltage devices generally have a nominal threshold voltage of about 0.75 volt and are intended to operate with the higher supply voltage VDDIO. The low-voltage devices generally have a nominal threshold voltage which is substantially lower than the high-voltage devices, such as, for example, about 0.35 volt, and are intended to operate with the lower core supply voltage VDDCORE.

Commonly used IO standards, such as, for example, HSTL, SSTL and GTL, generally employ receivers which include one or more comparators. Each of these comparators typically compares an input signal supplied thereto against a corresponding reference voltage and generates an output signal that is indicative of a difference between the input signal and the reference voltage. The output signals generated by the comparators are converted into corresponding digital CMOS signals that may be conveyed to core logic circuitry. IO standards such as HSTL, SSTL and GTL typically encompass a wide range of signaling levels. For example, HSTL signals can have a nominal swing in the range of about 1.2 to 1.8 volts, while SSTL signal swings can vary in the range of about 1.8 to 2.5 volts.

FIG. 1 is a schematic diagram depicting an illustrative comparator circuit 100 which can be used, for example, in a HSTL, SSTL or GTL receiver application. Comparator circuit 100 includes an input stage 102 utilizing a differential architecture, a single-ended output stage 104, and a bias circuit 106 for biasing the input and output stages 102, 104 at a desired quiescent operating point. Bias circuit 106 includes a high-voltage NMOS device MNIO1 connected in a diode arrangement and a current source 108 connected to MNIO1, the current source supplying a reference current, I0, upon which bias currents, IA and IB, in input stage 102 and output stage 104, respectively, are based. In order to function reliably in such HSTL, SSTL or GTL receiver applications, comparator circuit 100 operates at a higher supply voltage, such as VDDIO (e.g., 3.3 volts), and utilizes all high-voltage transistor devices. Accordingly, comparator circuit 100 may be referred to herein as a high-voltage comparator circuit.

The input stage 102 comprises first and second high-voltage NMOS devices MNIO4 and MNIO5 connected in a differential pair arrangement. Specifically, a source (S) of device MNIO4 is connected to a source of device MNIO5 at node N5, which may be referred to as a tail of input stage 102, a gate (G) of MNIO4 forms a first input, N, which may be an inverting input of the comparator circuit 100, and is adapted to receive a first input signal supplied to the comparator circuit, and a gate of MNIO5 forms a second input, P, which may be a non-inverting input of the comparator circuit, and is adapted to receive a second input signal supplied to the comparator circuit. The input differential pair comprised of devices MNIO4 and MNIO5 is connected to supply voltage VDDIO through a pull-up load configured as a current mirror including high-voltage PMOS devices MPIO6 and MPIO7. Specifically, a drain (D) of device MNIO4 is connected to a drain and gate of device MPIO6 at node N3, a drain of device MNIO5 is connected to a drain of device MPIO7 at node N4, a gate of MPIO7 is connected to the gate of MPIO6 at node N3, and sources of MPIO6 and MPIO7 are adapted for connection to supply voltage VDDIO. Input stage 102 further includes a high-voltage NMOS device MNIO2 having a drain connected to node N5, a source adapted for connection to VSS, which may be ground or an alternative voltage return, and a gate connected to the bias circuit 106 at node N2. Bias current IA in the input stage 102 will be proportional to reference current I0 in bias circuit 106 and will be a function of a ratio of a size (e.g., channel width-to-length ratio) of device MNIO1 to a size of device MNIO2.

The output stage 104 comprises a high-voltage NMOS device MNIO3 and a high-voltage PMOS device MPIO8. A source of device MNIO3 is adapted for connection to VSS, a gate of MNIO3 is connected to the gate of device MNIO1 in bias circuit 106 at node N2, a drain of MNIO3 is connected to a drain of device MPIO8 and forms an output, Z, of the comparator circuit 100 at node N1, a gate of MPIO8 is connected to an output of the input stage 102 at node N4, and a source of MPIO8 is adapted for connection to VDDIO. Bias current IB in the output stage 104 will be proportional to reference current I0 in bias circuit 106 and will be a function of a ratio of a size of device MNIO1 to a size of device MNIO3. The output stage 104 generates an output signal at the output Z of the comparator circuit 100 which is indicative of a difference between the signals presented to the inputs N and P of the comparator circuit.

Under direct current (DC) bias conditions, when the voltage potentials at inputs P and N of the comparator circuit 100 are substantially the same, equal amounts of current (e.g., IA/2) will flow through devices MNIO4 and MNIO5. When the voltage potential at input P exceeds the voltage potential at input N by a very small amount (e.g., millivolts), the current through device MNIO5 will increase significantly, primarily as a function of the gain of the devices, in comparison to the current through device MNIO4. The excess current flowing in device MNIO5 will cause node N4 to be pulled down towards VSS. This, in turn, will pull output Z up towards VDDIO further amplified by the gain of device MPIO8. Similarly, when the voltage potential at input P is lower than input N by a very small amount, the current through device MNIO5 will decrease significantly in comparison to the current through device MNIO4, thereby causing node N4 to be pulled up towards VDDIO. This, in turn, will pull output Z down towards VSS.

Unfortunately, however, a high-voltage comparator circuit, such as comparator circuit 100, suffers from several distinct disadvantages. For instance, the high-voltage transistor devices used in standard high-voltage comparator circuits typically have higher threshold voltages associated therewith compared to low-voltage transistor devices. This higher threshold voltage essentially limits the applicability of high-voltage comparator circuits to applications involving higher IO voltage signals (e.g., signal swings of greater than about 1.8 volts), since signals having smaller voltage swings generally do not provide enough overdrive to enable the high-voltage comparator circuit to function reliably, particularly over variations in PVT conditions to which the high-voltage comparator circuits may be subjected. Power dissipation in a high-voltage comparator circuit is also significantly higher than comparator circuits operating at a lower core logic supply voltage (e.g., VDDCORE). This excess power dissipation in the high-voltage comparator circuit results in undesirable heating in the chip, thereby necessitating the use of expensive package substrates and/or cooling techniques.

Another disadvantage of a high-voltage comparator circuit, such as comparator circuit 100, is that the output signal generated therefrom is typically not suitable for driving core logic circuitry. Generally, core logic circuitry operates at a substantially lower supply voltage (e.g., about 1.0 volt nominal) compared to the high-voltage comparator circuit, and therefore the voltage swing of the output signal, which can be greater than 1.8 volts, may damage core logic circuitry connected to the comparator circuit 100. Accordingly, it is necessary to first translate the output signal generated by the high-voltage comparator circuit down to levels suitable for use with core logic voltage levels, as shown in FIG. 2.

Figure 2:
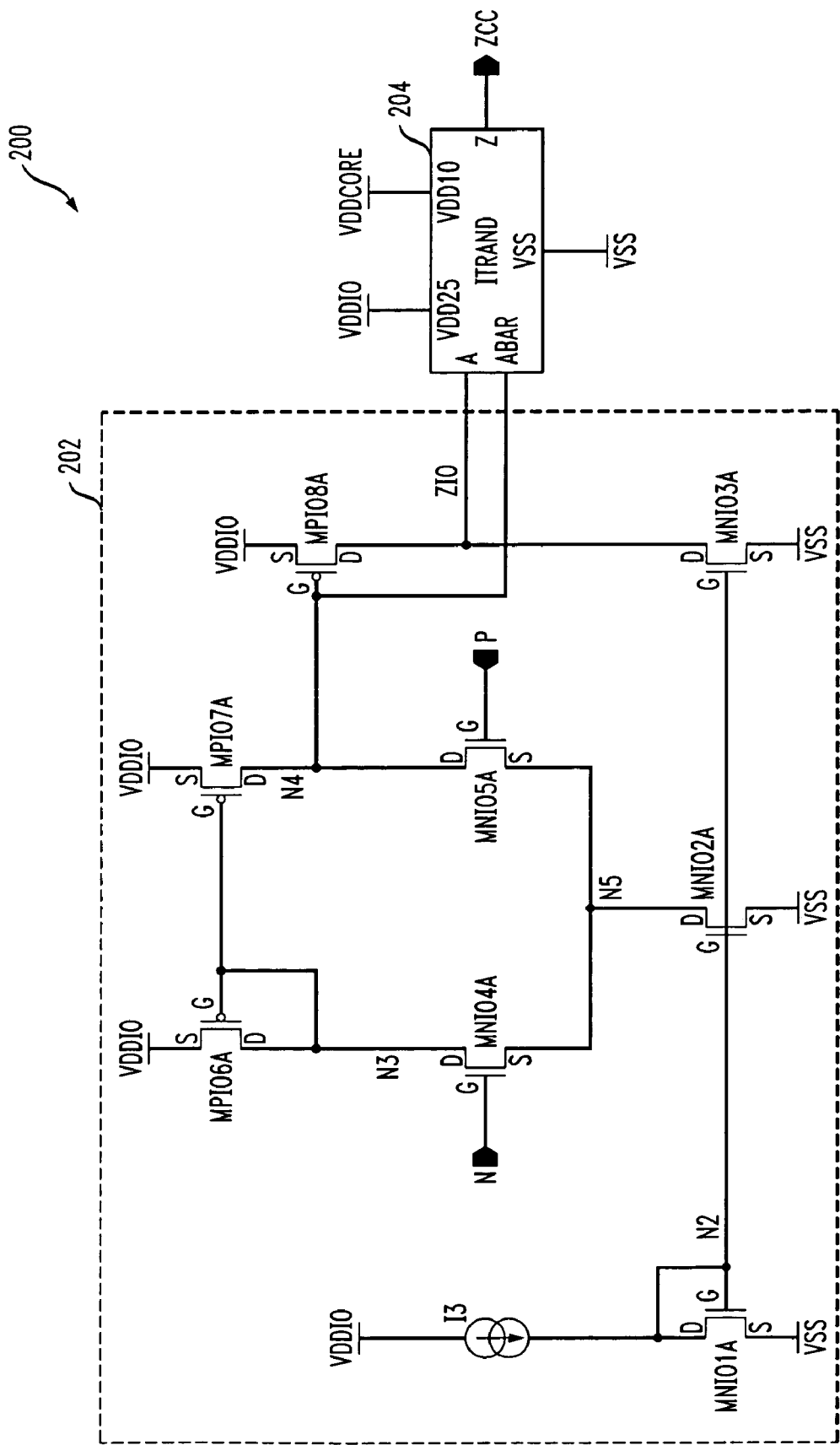
FIG. 2 is a schematic diagram depicting the high-voltage comparator circuit of FIG. 1 used in conjunction with a voltage level translator circuit.

FIG. 2 is a schematic diagram depicting an exemplary circuit 200 capable of comparing input signals referenced to a higher supply voltage, such as VDDIO, and generating an output signal referenced to a lower supply voltage, such as VDDCORE, which is indicative of a difference between the input signals. The circuit 200 includes a high-voltage comparator circuit 202, which can be implemented in a manner similar to comparator circuit 100 shown in FIG. 1, and a voltage level translator circuit 204 connected to an output of the high-voltage comparator circuit 202. The voltage level translator circuit 204 is operative to receive one or more signals, such as signal ZIO and a logical complement thereof generated by comparator circuit 202 which are referenced to the higher IO supply voltage VDDIO, and to generate an output signal, ZCC, referenced to the lower core logic supply voltage VDDCORE. The circuit arrangement shown in FIG. 2, although widely used, suffers from duty cycle distortion, among other disadvantages, that voltage level translator circuits typically introduce. Moreover, circuit 200, with the inclusion of voltage level translator circuit 204, consumes significantly more chip area and power compared to a comparator circuit which does not require such voltage level translation circuitry.

Figure 3:
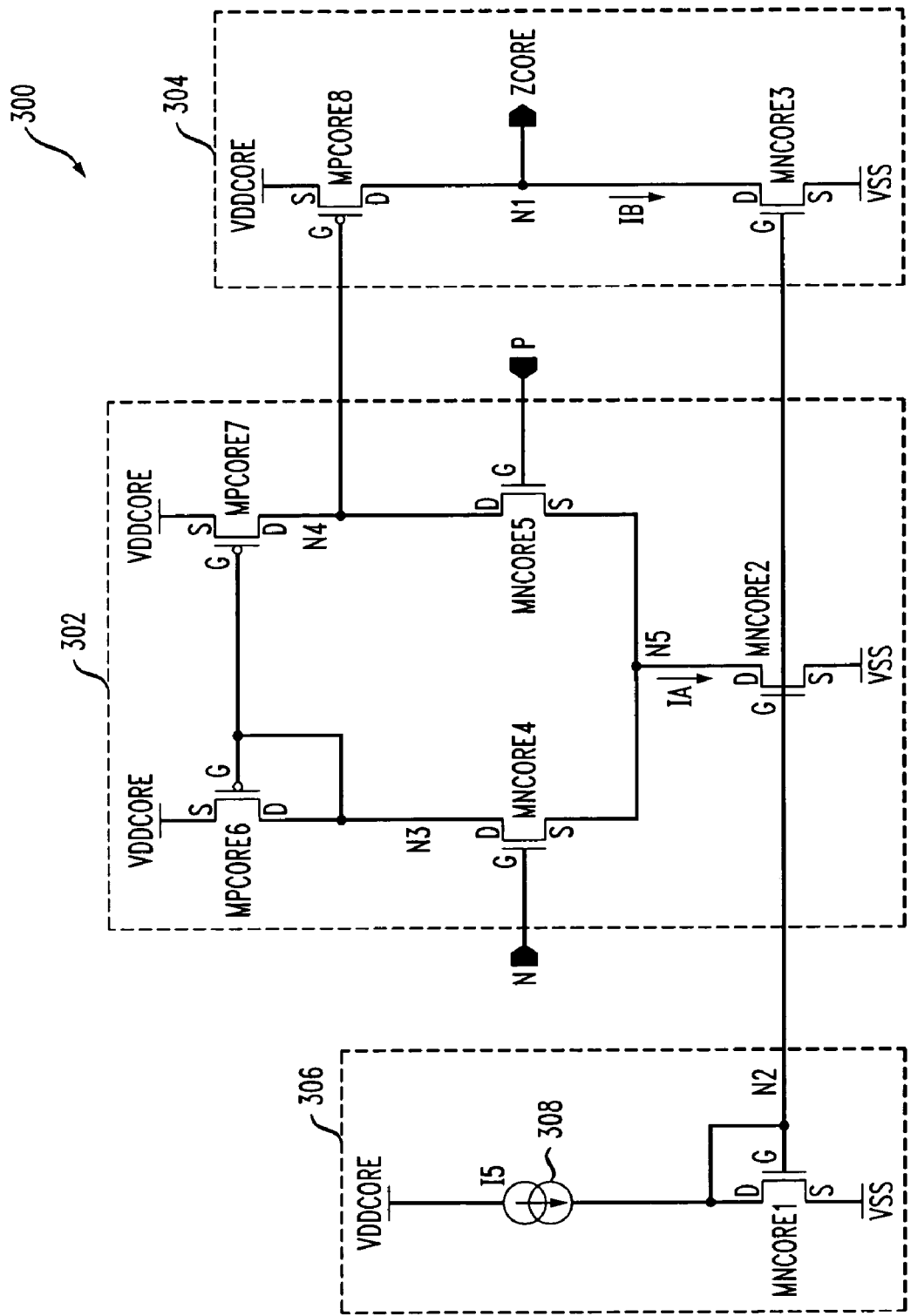
FIG. 3 is a schematic diagram depicting an illustrative low-voltage comparator circuit.

FIG. 3 is a schematic diagram depicting an illustrative comparator circuit 300 suitable for use in a core logic circuit application. Like high-voltage comparator circuit 100 shown in FIG. 1, comparator circuit 300 includes an input stage 302 utilizing a differential architecture, a single-ended output stage 304, and a bias circuit 306 for biasing the input and output stages 302, 304 at a desired quiescent operating point. Bias circuit 306 includes a low-voltage NMOS device MNCORE1 connected in a diode arrangement and a current source 308 connected to MNCORE1, the current source supplying a reference current, I5, upon which bias currents, IA and IB, in input stage 302 and output stage 304, respectively, are based. In order to function reliably in core logic circuit applications, comparator circuit 300 operates at a lower core supply voltage, such as VDDCORE (e.g., 1.0 volt), and utilizes all low-voltage transistor devices. Accordingly, comparator circuit 300 may be referred to herein as a low-voltage comparator circuit.

The input stage 302 comprises first and second low-voltage NMOS devices MNCORE4 and MNCORE5 connected in a differential pair arrangement. Specifically, a source of device MNCORE4 is connected to a source of device MNCORE5 at node N5, a gate of MNCORE4 forms a first input, N, which may be an inverting input of the comparator circuit 300, and is adapted to receive a first input signal supplied to the comparator circuit, and a gate of MNCORE5 forms a second input, P, which may be a non-inverting input of the comparator circuit, and is adapted to receive a second input signal supplied to the comparator circuit. The input differential pair comprised of devices MNCORE4 and MNCORE5 is connected to supply voltage VDDCORE through a pull-up load configured as a current mirror including low-voltage PMOS devices MPCORE6 and MPCORE7. Specifically, a drain of device MNCORE4 is connected to a drain and gate of device MPCORE6 at node N3, a drain of device MNCORE5 is connected to a drain of device MPCORE7 at node N4, a gate of MPCORE7 is connected to the gate of MPCORE6 at node N3, and sources of MPCORE6 and MPCORE7 are adapted for connection to supply voltage VDDCORE. Input stage 302 further includes a low-voltage NMOS device MNCORE2 having a drain connected to node N5, a source adapted for connection to VSS, which may be ground or an alternative voltage return, and a gate connected to the bias circuit 306 at node N2. Bias current IA in the input stage 302 will be proportional to reference current I5 in bias circuit 306 and will be a function of a ratio of a size (e.g., channel width-to-length ratio) of device MNCORE1 to a size of device MNCORE2.

The output stage 304 comprises a low-voltage NMOS device MNCORE3 and a low-voltage PMOS device MPCORE8. A source of device MNCORE3 is adapted for connection to VSS, a gate of MNCORE3 is connected to the gate of device MNCORE1 in bias circuit 306 at node N2, a drain of MNCORE3 is connected to a drain of device MPCORE8 and forms an output, ZCORE, of the comparator circuit 300 at node N1, a gate of MPCORE8 is connected to an output of the input stage 302 at node N4, and a source of MPCORE8 is adapted for connection to VDDCORE. Bias current IB in the output stage 304 will be proportional to reference current I5 in bias circuit 306 and will be a function of a ratio of a size of device MNCORE1 to a size of device MNCORE3. The output stage 304 generates an output signal at the output ZCORE of the comparator circuit 300 which is indicative of a difference between the signals presented to the inputs N and P of the comparator circuit.

As previously stated, low-voltage comparator circuit 300 utilizes all low-voltage devices and operates at the lower core supply voltage VDDCORE. The low-voltage devices have a lower breakdown voltage than high-voltage devices due primarily to their extremely thin gate oxide. Consequently, such low-voltage comparator circuits are only suitable for use with input signal levels that do not exceed the dielectric breakdown voltage of the low-voltage devices. This limits the applicability of low-voltage comparators to input signal swings that are typically less than about 1.2 volts, thereby making low-voltage comparator circuits not suitable for use in IO interface applications, such as, but not limited to, HSTL, SSTL, or GTL.

Figure 4:
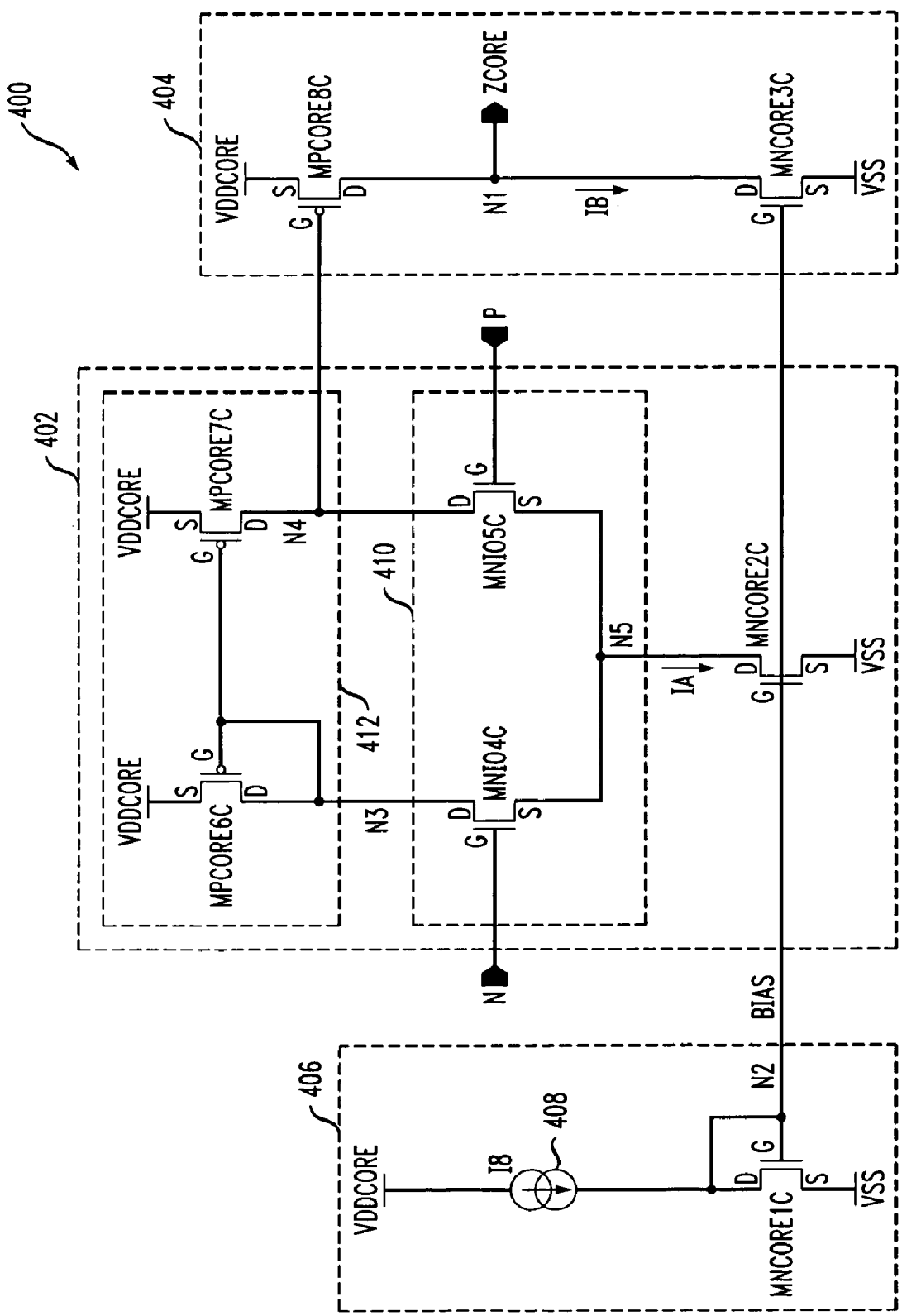
FIG. 4 is a schematic diagram depicting an exemplary comparator circuit having a wide input signal range, formed in accordance with an embodiment of the present invention.

FIG. 4 is a schematic diagram depicting an exemplary comparator circuit 400, formed in accordance with an embodiment of the present invention. The illustrative comparator circuit 400 combines the advantages of both low-voltage and high-voltage transistor devices to beneficially extend an input signal range of the comparator circuit. Comparator circuit 400 preferably comprises a differential amplifier 402 having first and second inputs forming an inverting input (N) and a non-inverting input (P), respectively, of the comparator circuit, and an output at node N4. The differential amplifier 402 is operative to receive at least first and second signals supplied to inputs N and P, and to amplify a difference between the first and second signals. The differential amplifier 402 generates a difference signal at its output which is a function of the difference between the first and second signals. Differential amplifier 402, which is merely illustrative, is not limited to this or any particular amplifier configuration.

Differential amplifier 402 preferably comprises a differential input stage 410 including a pair of high-voltage NMOS input devices MNIO4C and MNIO5C. Sources of MNIO4C and MNIO5C are connected together to form a common source node N5, and gates of MNIO4C and MNIO5C are connected to the inputs N and P, respectively, of the comparator circuit 400. The differential amplifier 402 further includes a simple current mirror 412 functioning as an active load for the differential input stage 410. The current mirror 412 preferably comprises a pair of low-voltage PMOS devices MPCORE6C and MPCORE7C, with MPCORE6C being connected in a diode configuration. Specifically, sources of MPCORE6C and MPCORE7C are preferably adapted for connection to a first supply voltage, which may be a lower core supply voltage VDDCORE, a gate and a drain of MPCORE6C are connected to a drain of MNIO4C at node N3, a gate of MPCORE7C is connected to the gate of MPCORE6C, and a drain of MPCORE7C is connected to a drain of MNIO5C at output node N4. Alternative load circuit arrangements (e.g., resistive loads, cascode loads, etc.) suitable for use with the differential amplifier 402 are similarly contemplated.

It is to be appreciated that, because a metal-oxide semiconductor (MOS) device is symmetrical in nature, and thus bidirectional, the assignment of source and drain designations in the MOS device is essentially arbitrary. Therefore, the source and drain of a given MOS device may be referred to herein generally as first and second source/drain, respectively, where the term "source/drain" in this context denotes a source or a drain.

Differential amplifier 402 further includes a current sink, which in this illustrative embodiment is implemented using a low-voltage NMOS device MNCORE2C, for providing a bias current, IA, for biasing the differential amplifier at a desired quiescent operating point. Alternative biasing arrangements are similarly contemplated by the present invention. Device MNCORE2C is preferably configured having a source adapted for connection to VSS, or an alternative voltage return of the comparator circuit 400, a drain connected to the differential input stage 410 at node N5, and a gate adapted for receiving a bias signal, BIAS. The magnitude of the bias current IA in the differential amplifier 402 is preferably controlled as a function of the bias signal BIAS.

The bias signal BIAS may be generated internally by the differential amplifier 402, or it may be provided by a bias circuit 406 included in the comparator circuit 400. It is also contemplated that the bias signal BIAS may be generated externally to the comparator circuit 400, such as by a local or a global bias source (not shown). Bias circuit 406 preferably includes a current source 408 generating a substantially constant current, I8, and a low-voltage NMOS device MNCORE1C connected to the current source in a diode arrangement. Specifically, a source of MNCORE1C is adapted for connection to VSS, and a gate and a drain of MNCORE1C are connected to the current source 408 at node N2 for generating the bias signal BIAS. Thus, MNCORE2C forms a current mirror with MNCORE1C, whereby bias current IA in the differential amplifier 402 will be proportional to reference current I8 in bias circuit 406 and will be a function of a ratio of a size (e.g., channel width-to-length ratio) of device MNCORE1C to a size of device MNCORE2C. Additionally, by selectively turning off the bias circuit 406 in response to a control signal, such as, for example, during a power-down mode of operation, DC power consumption in the differential amplifier 402, and thus in the comparator circuit 400, may be beneficially reduced.

The output node N4 of the differential amplifier 402 is a relatively high impedance node (e.g., greater than about 100 kilo ohms). High output impedance can be undesirable, particularly when driving a small resistance and/or a large capacitive load. A small load resistance requires a large output current in order to provide a correspondingly large output voltage swing. Likewise, a large load capacitance requires a large output current to supply charging currents needed to meet transient response requirements. In order to provide a sufficient output current on a steady-state or transient basis, it is desirable to connect a low-resistance output stage 404 to the output of the differential amplifier 402 at node N4.

The output stage 404 preferably comprises a low-voltage NMOS device MNCORE3C and a low-voltage PMOS device MPCORE8C configured for class-A operation. Specifically, a source of MNCORE3C is preferably adapted for connection to VSS, a gate of MNCORE3C is adapted for receiving the bias signal BIAS, and a drain of MNCORE3C is connected to a drain of MPCORE8C and forms the output ZCORE of the comparator circuit 400 at node N1. A source of MPCORE8C is preferably adapted for connection to core supply voltage VDDCORE, and a gate of MPCORE8C is connected to the output of the differential amplifier 402 at node N4. In this configuration, device MNCORE3C functions essentially as a current mirror in conjunction with MNCORE1C for generating bias current IB having a magnitude which is controlled as a function of bias signal BIAS. Thus, bias current IB will be proportional to reference current I8 in bias circuit 406 and will be a function of a ratio of a size of device MNCORE1C to a size of device MNCORE3C.

Output stage 404 is preferably configured to buffer the output of the differential amplifier 402. As apparent from the figure, the output stage 404 generates an output signal at the output ZCORE of the comparator circuit 400 which is a logical complement of the output signal provided by the differential amplifier 402 at node N4. It is to be understood, however, that the output stage 404 need not provide an inversion of the differential amplifier output signal. Moreover, the output stage 404 is not limited to any particular number of stages, or to the use of stages exclusively. For example, one or more logic stages (e.g., inverter) may be connected to node N1 to provide a substantially rail-to-rail output signal swing at output ZCORE of the comparator circuit 400, without consuming any significant DC power, as will be understood by those skilled in the art.

The configuration of comparator circuit 400 advantageously extends the ability of the comparator circuit to accept signaling levels that are lower than high-voltage comparator circuits, such as comparator circuit 100 shown in FIG. 1. This extension is particularly useful, for example, in HSTL and SSTL IO interface applications that require support for 1.8 volt signaling. This is made possible primarily by the fact that the bias devices MNCORE2C and MNCORE3C are low-voltage devices having significantly lower threshold voltages compared to high-voltage devices, thereby extending the range over which node N5 can vary towards VSS. This additional range available at node N5 beneficially translates to a reduction in a minimum input signal level of the comparator circuit 400. With the desire to push IO input signaling levels lower, there is a growing need to design comparator circuits capable of accepting even lower input signal swings while retaining backward compatibility to support previous generation IO standards.

Figure 5:
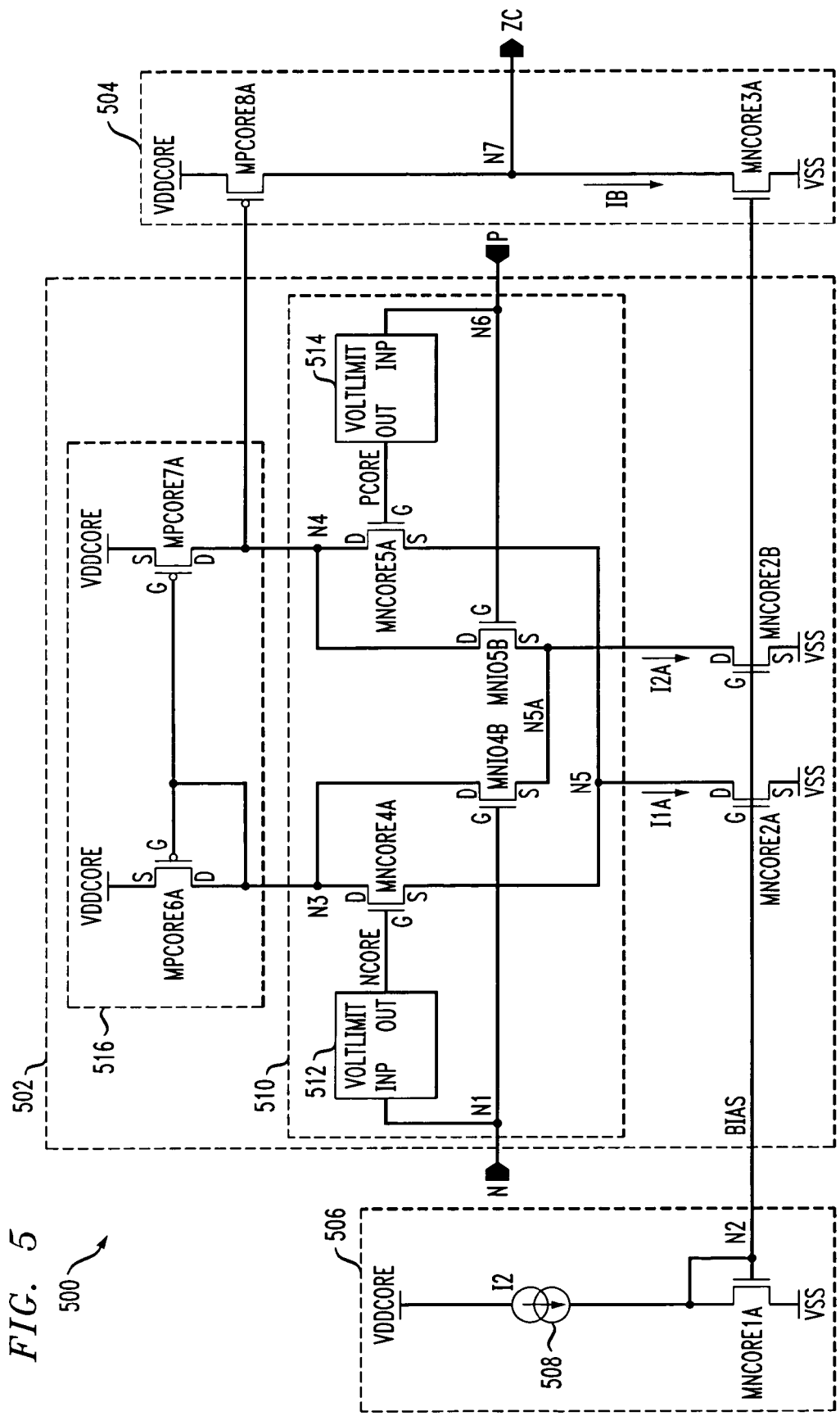
FIG. 5 is a schematic diagram depicting an exemplary comparator circuit having a wide input signal range, formed in accordance with another embodiment of the present invention.

FIG. 5 is a schematic diagram depicting an exemplary comparator circuit 500, formed in accordance with another embodiment of the present invention. Comparator circuit 500 preferably comprises a differential amplifier 502 having first and second inputs forming an inverting input (N) and a non-inverting input (P), respectively, of the comparator circuit, and an output at node N4. The differential amplifier 502, which is merely illustrative, is operative to receive at least first and second signals supplied to inputs N and P, and to amplify a difference between the first and second signals. The differential amplifier 502 generates a difference signal at its output that is a function of the difference between the first and second signals. It is to be understood that the comparator circuit 500 is not limited to the particular circuit arrangement shown.

Comparator circuit 500 is preferably operable at an even lower input common mode range than comparator circuit 400 shown in FIG. 4. To accomplish this, the differential amplifier 502 in comparator circuit 500 preferably comprises a differential input stage 510 which includes a pair of low-voltage devices that function at lower input signal levels (e.g., less than about 1.2 volts), and a pair of high-voltage devices that function at higher input signal levels (e.g., greater than about 1.2 volts). Specifically, the differential input stage 510, like differential input stage 410 depicted in FIG. 4, preferably includes a pair of high-voltage NMOS devices MNIO4B and MNIO5B. Sources of MNIO4B and MNIO5B are connected together to form a common source node N5A, and gates of MNIO4B and MNIO5B are connected to the inputs N and P, respectively, of the comparator circuit 500. In addition, differential input stage 510 preferably comprises a pair of low-voltage NMOS devices MNCORE4A and MNCORE5A. Sources of MNCORE4A and MNCORE5A are connected together to form a common source node N5, a drain of MNCORE4A is connected to a drain of MNIO4B, a drain of MNCORE5A is connected to a drain of MNIO5B, and gates of MNCORE4A and MNCORE5A are connected to the inputs N and P, respectively, of the comparator circuit 500 via voltage limiting circuits 512 and 514, respectively.

Voltage limiting circuit 512 preferably includes an input, INP, connected to the gate of MNIO4B at node N1 for receiving a first input signal applied to the inverting input N of the comparator circuit 500. Voltage limiting circuit 512 further includes an output, OUT, connected to the gate of MNCORE4A at node NCORE for supplying a signal, generated by the voltage limiting circuit 512, to MNCORE4A. The signal generated by voltage limiting circuit 512 is preferably substantially equal to the first input signal, only clamped to a prescribed maximum level, such as about 1.2 volts. It is to be appreciated that the invention is not limited to any specific maximum voltage level for the voltage limiting circuits. Likewise, voltage limiting circuit 514 preferably includes an input, INP, connected to the gate of MNIO5B at node N6 for receiving a second input signal applied to the non-inverting input P of the comparator circuit 500. Voltage limiting circuit 514 also includes an output, OUT, connected to the gate of MNCORE5A at node PCORE for supplying a signal generated by the voltage limiting circuit 514 to MNCORE5A. The signal generated by voltage limiting circuit 514 is preferably substantially equal to the second input signal, only clamped to a prescribed maximum level. The voltage limiting circuits 512, 514 function primarily to limit the voltage that can appear at the gates of the low-voltage devices MNCORE4A and MNCORE5A, respectively, to an acceptable level (e.g., less than a dielectric breakdown voltage of the low-voltage devices) so as to avoid damaging devices MNCORE4A and MNCORE5A when higher input signals levels (e.g., greater than about 1.2 volts) are applied to the comparator circuit 500.

The differential amplifier 502 further includes a current mirror 516 functioning as an active load for the differential input stage 510. The current mirror 516, like current mirror 412 shown in FIG. 4, preferably comprises a pair of low-voltage PMOS devices MPCORE6A and MPCORE7A, with MPCORE6A being connected in a diode configuration. Specifically, sources of MPCORE6A and MPCORE7A are preferably adapted for connection to a first supply voltage, which may be a lower core supply voltage VDDCORE, a gate and a drain of MPCORE6A are connected to the drains of MNIO4B and MNCORE4A at node N3, a gate of MPCORE7A is connected to the gate of MPCORE6A, and a drain of MPCORE7A is connected to drains of MNIO5B and MNCORE5A at output node N4. Alternative load circuit arrangements (e.g., resistive loads, cascode loads, etc.) suitable for use with the differential amplifier 502 are similarly contemplated.

Differential amplifier 502 further includes a current sink, which in this illustrative embodiment may be implemented using a pair of low-voltage NMOS devices, MNCORE2A and MNCORE2B, providing bias currents, I1A and I2A, respectively, for biasing the differential amplifier at a desired quiescent operating point. Alternative biasing arrangements are similarly contemplated by the present invention. Sources of devices MNCORE2A and MNCORE2B are preferably adapted for connection to VSS, or an alternative voltage return of the comparator circuit 500, a drain of MNCORE2A is connected to the differential input stage 410 at node N5, a drain of MNCORE2B is connected to the differential input stage at node N5A, and gates of MNCORE2A and MNCORE2B are adapted for receiving a bias signal, BIAS. The magnitude of the bias currents I1A and I2A in the differential amplifier 502 are preferably controlled as a function of the bias signal BIAS.

The bias signal BIAS may be generated internally by the differential amplifier 502, or alternatively it may be provided by a bias circuit 506 included in the comparator circuit 500. It is also contemplated that the bias signal BIAS may be generated externally to the comparator circuit 500, such as by a local or a global bias source (not shown). Bias circuit 506 preferably includes a current source 508 generating a substantially constant current, I2, and a low-voltage NMOS device MNCORE1A connected to the current source in a diode arrangement, for example in a manner consistent with the bias circuit 406 depicted in FIG. 4. Bias current I1A in the differential amplifier 502 will be proportional to reference current I2 in bias circuit 506 and will be a function of a ratio of a size (e.g., channel width-to-length ratio) of device MNCORE1A to a size of device MNCORE2A. Similarly, Bias current I2A will be proportional to reference current I2 and will be a function of a ratio of the size of device MNCORE1A to a size of device MNCORE2B. Additionally, by selectively turning off the bias circuit 406 in response to a control signal, such as, for example, during a power-down mode of operation, DC power consumption in the differential amplifier 502, and thus in the comparator circuit 500, may be beneficially reduced.

The comparator circuit 500 preferably includes an output stage 504 operative to buffer the output of the differential amplifier 502. The output stage 504 preferably comprises a low-voltage NMOS device MNCORE3A and a low-voltage PMOS device MPCORE8A connected in a class-A configuration. Specifically, a source of MNCORE3A is preferably adapted for connection to VSS, a gate of MNCORE3A is adapted for receiving the bias signal BIAS, and a drain of MNCORE3A is connected to a drain of MPCORE8A and forms the output ZC of the comparator circuit 500 at node N7. A source of MPCORE8A is preferably adapted for connection to VDDCORE, and a gate of MPCORE8A is connected to the output of the differential amplifier 502 at node N4. In this configuration, device MNCORE3A functions essentially as a current mirror in conjunction with MNCORE1A for generating a bias current IB having a magnitude which is controlled as a function of bias signal BIAS. Thus, bias current IB in the output stage 504 will be proportional to reference current I2 in bias circuit 506 and will be a function of a ratio of a size of device MNCORE1A to a size of device MNCORE3A.

The operation of the exemplary comparator circuit 500 can be described as follows. At lower input signal levels, such as, for example, when the signals applied to the inverting (N) and non-inverting (P) inputs of the comparator circuit 500 are less than about 1.2 volts, the voltage limiting circuits 512, 514 will preferably propagate the signals appearing at the inputs of the comparator circuit to nodes NCORE and PCORE, respectively, of the differential input stage 510. Gain devices MNCORE4A and MNCORE5A, load devices MPCORE6A and MPCORE7A, and current sink MNCORE2A, preferably function in a manner similar to a low-voltage comparator circuit. The high-voltage devices MNIO4B and MNIO5B will be essentially in an off state at such lower input signal levels due primarily to the fact that the gate-to-source voltages of the high-voltage devices will be lower than their threshold voltages.

At higher input signal levels, such as, for example, when the signals applied to the inputs N, P of the comparator circuit 500 are greater than about 1.2 volts and lower than the dielectric breakdown voltage of the high-voltage devices (e.g., SSTL levels), the voltage limiting circuits 512, 514 will preferably clamp the signal levels at nodes NCORE and PCORE to less than the dielectric breakdown voltage of the low-voltage devices (e.g., less than about 1.2 volts). The high-voltage devices MNIO4B and MNIO5B will now have ample overdrive to function as gain devices since their gate-to-source voltages will be higher than their threshold voltages. Devices MNIO4B and MNIO5B, along with load devices MPCORE6A and MPCORE7A, and current sink MNCORE2B, preferably function in a manner similar to comparator circuit 400 described above with reference to FIG. 4.

Figure 6:
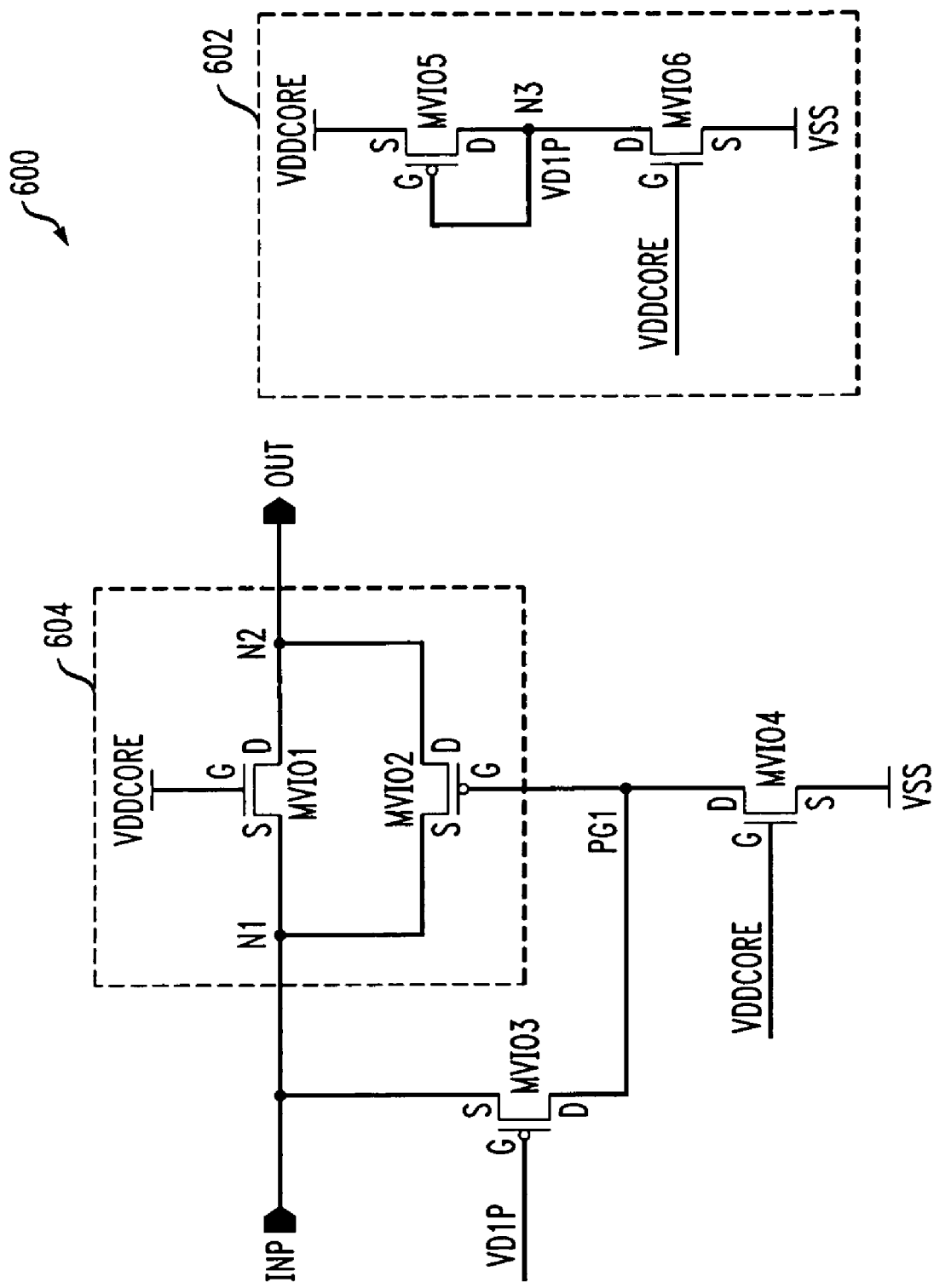
FIG. 6 is a schematic diagram depicting an exemplary voltage limiter circuit suitable for use with the comparator circuit of FIG. 5, in accordance with an aspect of the present invention.

FIG. 6 is a schematic diagram depicting an exemplary voltage limiting circuit suitable for use with the comparator circuit 500 shown in FIG. 5, in accordance with an embodiment of the invention. Voltage limiting circuit 600 preferably comprises high-voltage NMOS devices MVIO1 and MVIO4, and high-voltage PMOS devices MVIO2 and MVIO3. Devices MVIO1 and MVIO2 are preferably connected in parallel between an input, INP, and an output, OUT, of the voltage limiting circuit 600 and serves as a transmission gate 604. Specifically, sources of MVIO1 and MVIO2 are connected to the input INP at node N1, drains of MVIO1 and MVIO2 are connected to the output OUT at node N2, and a gate of MVIO1 is adapted for connection to lower core supply voltage VDDCORE.

A gate of MVIO2 is selectively connected to VSS through device MVIO4. Specifically, the gate of MVIO2 is preferably connected to a drain of MVIO4 at node PG1, a source of MVIO4 is adapted for connection to VSS, and a gate of MVIO4 is adapted for connection to VDDCORE. Normally, when VDDCORE is greater than about a low-voltage device threshold above VSS, MVIO4 will be turned on thereby pulling node PG1 substantially to VSS. When VDDCORE is less than or about equal to the threshold voltage of MVIO4 (e.g., about 0.75 volt), MVIO4 will be turned off, and thus node PG1 could potentially float. In order to prevent node PG1 from being undefined, device MVIO3 is connected having a source connected to the input INP at node N1, a drain connected to node PG1, and a gate adapted for receiving a control signal, VD1P. Control signal VD1P may be generated, for example, by a reference circuit 602 included in voltage limiting circuit 600. It is similarly contemplated that control signal VD1P may be generated externally and supplied to the voltage limiting circuit 600.

Reference circuit 602 is preferably a simple voltage divider circuit including a high-voltage PMOS device MVIO5 connected in a diode arrangement to a high-voltage NMOS device MVIO6. Specifically, a source of MVIO5 is preferably adapted for connection to VDDCORE, a gate and a drain of MVIO5 are connected to a drain of MVIO6 at node N3 for generating the control signal VD1P, a source of MVIO6 is adapted for connection to VSS, and a gate of MVIO6 is adapted for connection to VDDCORE. During normal operation, MVIO6 will be turned on, thereby causing current to flow through devices MVIO5 and MVIO6, and the control signal VD1P will be about a threshold voltage below VDDCORE. Alternative reference circuit arrangements suitable for use with voltage limiting circuit 600 are similarly contemplated by the invention.

The operation of the voltage limiting circuit 600 can be described as follows. When the voltage at node N1 is below VDDCORE, device MVIO3 will be turned off since its gate-to-source voltage will be below its threshold voltage, which is nominally about 0.75 volt. Under this condition, node PG1 is pulled towards VSS by device MVIO4, thereby turning on device MVIO2. Devices MVIO1 and MVIO2 together function as a transmission gate that passes a signal at the input INP of the voltage limiting circuit 600 to the output OUT when the voltage at node N1 is below VDDCORE. In this instance, the voltage at node N2 will be substantially the same as the voltage at node N1. When the voltage at node N1 exceeds VDDCORE by a small amount, such as a high-voltage device threshold above VDDCORE, device MVIO3 turns on, thereby effectively connecting the source and gate of device MVIO2 and turning off MVIO2. Device MVIO1 will be turned off whenever the potential at node N1 exceeds a threshold voltage below VDDCORE, thereby turning off the transmission gate 604 comprised of devices MVIO1 and MVIO2. In this manner, the voltage at node N2 will be limited to a maximum value which is substantially equal to about a threshold voltage above VDDCORE.

By using a combination of both high-voltage devices and low-voltage devices, the extended input signal range comparator circuits 400, 500 are operative to combine the advantages of a low-voltage comparator circuit and a high-voltage comparator circuit. Although described herein in the context of illustrative comparator circuits, it will become apparent to those skilled in the art that the techniques for extending input signal level range are equally applicable to forming an input stage of other circuits, including, but not limited to, differential amplifiers, operational amplifiers, etc., wherein it is desirable to have a wide input signal level range without significantly increasing power dissipation.

It is also to be appreciated that the techniques of the present invention for extending the input signal range in exemplary comparator circuits 400 and 500 may be implemented using alternative circuit configurations, as previously stated. For example, although not shown, in the differential amplifier 402 shown in FIG. 4, high-voltage PMOS devices may be substituted for the high-voltage NMOS devices MNIO4C and MNIO5C, a low-voltage PMOS device may be substituted for low-voltage NMOS device MNCORE2C, and low-voltage NMOS devices may be substituted for the low-voltage PMOS devices MPCORE6C and MPCORE7C, while flipping the respective polarities of the voltage supplies VDDCORE and VSS, with essentially no significant change in the operation of the comparator circuit, as will be understood by those skilled in the art. Additionally, although VDDCORE is preferably about 1.0 volt and VSS is about zero volts (e.g., ground), the invention is not limited to any particular voltage levels for VDDCORE and VSS. For example, VDDCORE may be about zero volts and VSS may be about −1.0 volt.

At least a portion of the comparator circuits of the present invention may be implemented in an integrated circuit. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A circuit having an enhanced input signal range, the circuit comprising:
    a differential amplifier operative to receive at least first and second signals and to amplify a difference between the first and second signals, the differential amplifier generating a difference signal at an output thereof which is a function of the difference between the first and second signals, the differential amplifier comprising:
        an input stage including at least first and second transistors, each of the first and second transistors having a first threshold voltage associated therewith, the first and second transistors being operative to receive the first and second signals, respectively; and
        a load including at least third and fourth transistors, each of the third and fourth transistors having a second threshold voltage associated therewith, the first threshold voltage being greater than the second threshold voltage, the load being adapted for connection to a first voltage source supplying a first voltage and to the input stage, the output of the differential amplifier being formed at a junction between the load and the input stage; and
    an output stage coupled to the differential amplifier and being operative to receive the difference signal and to generate an output signal of the circuit, the output signal being indicative of the difference signal and being referenced to the first voltage source;
    wherein the circuit is configured to accept the first and second signals having a voltage swing which is potentially greater than the first voltage.

2. The circuit of claim 1, wherein the load comprises a current mirror including first and second PMOS devices, each of the first and second PMOS devices having the second threshold voltage associated therewith, sources of the first and second PMOS devices being adapted for connection to the first voltage source, a gate and a drain of the first PMOS device being connected to the input stage at a first node, a gate of the second PMOS device being connected to the gate of the first PMOS device, and a drain of the second PMOS device being connected to the input stage at a second node and forming the output of the differential amplifier.

3. The circuit of claim 1, wherein the input stage in the differential amplifier comprises first and second NMOS devices, each of the first and second NMOS devices having the first threshold voltage associated therewith, sources of the first and second NMOS devices being connected to a bias source, a drain of the first NMOS device being connected to the load at a first node, a drain of the second NMOS device being connected to the load at a second node and forming the output of the differential amplifier, a gate of the first NMOS device forming an inverting input of the differential amplifier and being adapted for receiving the first signal, and a gate of the second NMOS device forming a non-inverting input of the differential amplifier and being adapted for receiving the second input signal.

4. The circuit of claim 1, wherein the differential amplifier further comprises a bias source connected to the input stage, the bias source being operative to bias the differential amplifier at a quiescent operating point.

5. The circuit of claim 4, wherein the bias source comprises an NMOS device having the second threshold voltage associated therewith, a drain of the NMOS device being connected to the input stage, a source of the NMOS device being adapted for connection to a voltage return of the circuit, and a gate of the NMOS device being adapted for receiving a bias signal, a quiescent current in the differential amplifier being controlled as a function of the bias signal.

6. The circuit of claim 1, wherein the differential amplifier comprises:
    first and second NMOS devices, each of the first and second NMOS devices having the first threshold voltage associated therewith, a source of the first NMOS device being connected to a source of the second NMOS device at a first node, a gate of the first NMOS device forming an inverting input of the differential amplifier and being adapted for receiving the first signal, a gate of the second NMOS device forming a non-inverting input of the differential amplifier and being adapted for receiving the second signal;
    first and second PMOS devices, each of the first and second PMOS devices having the second threshold voltage associated therewith, a source of the first PMOS device being adapted for connection to the first voltage source, a gate and a drain of the first PMOS device being connected to a drain of the first NMOS device, a source of the second PMOS device being adapted for connection to the first voltage source, a gate of the second PMOS device being connected to the gate of the first PMOS device, and a drain of the second PMOS device being connected to a drain of the second NMOS device and forming an output of the differential amplifier; and
    a third NMOS device having the second threshold voltage associated therewith, a drain of the third NMOS device being connected to the sources of the first and second NMOS devices, a source of the third NMOS device being adapted for connection to a voltage return of the circuit, and a gate of the third NMOS device being adapted for receiving a bias signal, a quiescent current in the differential amplifier being controlled as a function of the bias signal.

7. The circuit of claim 1, wherein the output stage comprises:
- a PMOS device having the second threshold voltage associated therewith, a source of the PMOS device being adapted for connection to the first voltage source and a gate of the PMOS device being connected to the output of the differential amplifier; and
- an NMOS device having the second threshold voltage associated therewith, a source of the NMOS device being adapted for connection to a voltage return of the circuit, a drain of the NMOS device being connected to a drain of the PMOS device and generating the output signal of the circuit, and a gate of the NMOS device being adapted for receiving a bias signal, a quiescent current in the output stage being controlled as a function of the bias signal.

8. The circuit of claim 1, further comprising a bias generator operative to generate a bias signal, a quiescent current in at least one of the differential amplifier and the output stage being controlled as a function of the bias signal.

9. The circuit of claim 1, wherein the input stage in the differential amplifier comprises:
- a first voltage limiting circuit operative to receive the first signal and to generate a first clamp signal, the first clamp signal being substantially equal to the first signal when the first signal is less than a maximum voltage level, and the first clamp signal being substantially equal to the maximum voltage level when the first signal is greater than or equal to the maximum voltage level;
- a second voltage liming circuit operative to receive the second signal and to generate a second clamp signal, the second clamp signal being substantially equal to the second signal when the second signal is less than the maximum voltage level and the second clamp signal being substantially equal to the maximum voltage level when the second signal is greater than or equal to the maximum voltage level;
- a first differential pair including at least two transistors having the first threshold voltage associated therewith, the first differential pair being connected between the load and a first node of the bias source and being operative to receive the first and second signals; and
- a second differential pair including at least two transistors having the second threshold voltage associated therewith, the second differential pair being connected between the load and a second node of the bias source and being operative to receive the first and second clamp signals.

10. The circuit of claim 9, wherein at least one of the first and second voltage limiting circuits comprises:
- a transmission gate connected between an input and an output of the voltage limiting circuit, the transmission gate including at least first and second control inputs, a first control input being adapted for connection to the first voltage source;
- a first NMOS device having the first threshold voltage associated therewith, the first NMOS device including a source adapted for connection to a voltage return of the circuit, a drain connected to the second control input of the transmission gate, and a gate adapted for connection to the first voltage source; and
- a first PMOS device having the first threshold voltage associated therewith, the first PMOS device including a source connected to the input of the voltage limiting circuit, a drain connected to the second control input, and a gate adapted for receiving a control signal, the first PMOS device selectively disabling at least a portion of the transmission gate as a function of the control signal.

11. The circuit of claim 1, wherein the input stage in the differential amplifier comprises:
- first and second NMOS devices, each of the first and second NMOS devices having the first threshold voltage associated therewith, sources of the first and second NMOS devices being connected to a first node of a bias source, a drain of the first NMOS device being connected to the load at a first node, a drain of the second NMOS device being connected to the load at a second node and forming the output of the differential amplifier, a gate of the first NMOS device forming an inverting input of the differential amplifier and being adapted for receiving the first signal, and a gate of the second NMOS device forming a non-inverting input of the differential amplifier and being adapted for receiving the second input signal;
- first and second voltage limiting circuits, the first voltage limiting circuit being operative to receive the first signal and to generate a first clamp signal, the first clamp signal being substantially equal to the first signal when the first signal is less than or equal to a prescribed maximum voltage level and the first clamp signal being substantially equal to the maximum voltage level when the first signal is greater than the maximum voltage level, the second voltage limiting circuit being operative to receive the second signal and to generate a second clamp signal, the second clamp signal being substantially equal to the second signal when the second signal is less than or equal to the maximum voltage level and the second clamp signal being substantially equal to the maximum voltage level when the second signal is greater than the maximum voltage level; and
- third and fourth NMOS devices, each of the third and fourth NMOS devices having the second threshold voltage associated therewith, sources of the third and fourth NMOS devices being connected to a second node of the bias source, a drain of the third NMOS device being connected to the drain of the first NMOS device, a drain of the fourth NMOS device being connected to the drain of the second NMOS device, a gate of the third NMOS device being connected to the first voltage limiting circuit and being adapted to receive the first clamp signal, and a gate of the fourth NMOS device being connected to the second voltage limiting circuit and being adapted to receive the second clamp signal.

12. An integrated circuit including at least one circuit having an enhanced input signal range, the at least one circuit comprising:
- a differential amplifier operative to receive at least first and second signals and to amplify a difference between the first and second signals, the differential amplifier generating a difference signal at an output thereof which is a function of the difference between the first and second signals, the differential amplifier comprising:
  - an input stage including at least first and second transistors, each of the first and second transistors having a first threshold voltage associated therewith, the first and second transistors being operative to receive the first and second signals, respectively; and
  - a load including at least third and fourth transistors, each of the third and fourth transistors having a second threshold voltage associated therewith, the first threshold voltage being greater than the second threshold voltage, the load being adapted for connection to a first voltage source supplying a first voltage and to the input stage, the output of the differential amplifier being formed at a junction between the load and the input stage; and an output stage coupled to the differential amplifier and being operative to receive the difference signal and to generate an output signal of the at least one circuit, the output signal being indicative of the difference signal and being referenced to the first voltage source;

wherein the at least one circuit is configured to accept the first and second signals having a voltage swing which is potentially greater than the first voltage.

13. The integrated circuit of claim 12, wherein the load comprises a current mirror including first and second PMOS devices, each of the first and second PMOS devices having the second threshold voltage associated therewith, sources of the first and second PMOS devices being adapted for connection to the first voltage source, a gate and a drain of the first PMOS device being connected to the input stage at a first node, a gate of the second PMOS device being connected to the gate of the first PMOS device, and a drain of the second PMOS device being connected to the input stage at a second node and forming the output of the differential amplifier.

14. The integrated circuit of claim 12, wherein the input stage in the differential amplifier comprises first and second NMOS devices, each of the first and second NMOS devices having the first threshold voltage associated therewith, sources of the first and second NMOS devices being connected to a bias source, a drain of the first NMOS device being connected to the load at a first node, a drain of the second NMOS device being connected to the load at a second node and forming the output of the differential amplifier, a gate of the first NMOS device forming an inverting input of the differential amplifier and being adapted for receiving the first signal, and a gate of the second NMOS device forming a non-inverting input of the differential amplifier and being adapted for receiving the second input signal.

15. The integrated circuit of claim 12, wherein the differential amplifier further comprises a bias source connected to the input stage, the bias source being operative to bias the differential amplifier at a quiescent operating point.

16. The integrated circuit of claim 15, wherein the bias source comprises an NMOS device having the second threshold voltage associated therewith, a drain of the NMOS device being connected to the input stage, a source of the NMOS device being adapted for connection to a voltage return of the at least one circuit, and a gate of the NMOS device being adapted for receiving a bias signal, a quiescent current in the differential amplifier being controlled as a function of the bias signal.

17. The integrated circuit of claim 12, wherein the differential amplifier comprises:

first and second NMOS devices, each of the first and second NMOS devices having the first threshold voltage associated therewith, a source of the first NMOS device being connected to a source of the second NMOS device at a first node, a gate of the first NMOS device forming an inverting input of the differential amplifier and being adapted for receiving the first signal, a gate of the second NMOS device forming a non-inverting input of the differential amplifier and being adapted for receiving the second signal;

first and second PMOS devices, each of the first and second PMOS devices having the second threshold voltage associated therewith, a source of the first PMOS device being adapted for connection to the first voltage source, a gate and a drain of the first PMOS device being connected to a drain of the first NMOS device, a source of the second PMOS device being adapted for connection to the first voltage source, a gate of the second PMOS device being connected to the gate of the first PMOS device, and a drain of the second PMOS device being connected to a drain of the second NMOS device and forming an output of the differential amplifier; and a third NMOS device having the second threshold voltage associated therewith, a drain of the third NMOS device being connected to the sources of the first and second NMOS devices, a source of the third NMOS device being adapted for connection to a voltage return of the at least one circuit, and a gate of the third NMOS device being adapted for receiving a bias signal, a quiescent current in the differential amplifier being controlled as a function of the bias signal.

18. The integrated circuit of claim 12, wherein the input stage in the differential amplifier comprises:

a first voltage limiting circuit operative to receive the first signal and to generate a first clamp signal, the first clamp signal being substantially equal to the first signal when the first signal is less than a maximum voltage level, and the first clamp signal being substantially equal to the maximum voltage level when the first signal is greater than or equal to the maximum voltage level;

a second voltage liming circuit operative to receive the second signal and to generate a second clamp signal, the second clamp signal being substantially equal to the second signal when the second signal is less than the maximum voltage level and the second clamp signal being substantially equal to the maximum voltage level when the second signal is greater than or equal to the maximum voltage level;

a first differential pair including at least two transistors having the first threshold voltage associated therewith, the first differential pair being connected between the load and a first node of the bias source and being operative to receive the first and second signals; and a second differential pair including at least two transistors having the second threshold voltage associated therewith, the second differential pair being connected between the load and a second node of the bias source and being operative to receive the first and second clamp signals.

19. The integrated circuit of claim 18, wherein at least one of the first and second voltage limiting circuits comprises:

a transmission gate connected between an input and an output of the voltage limiting circuit, the transmission gate including at least first and second control inputs, a first control input being adapted for connection to the first voltage source;

a first NMOS device having the first threshold voltage associated therewith, the first NMOS device including a source adapted for connection to a voltage return of the at least one circuit, a drain connected to the second control input of the transmission gate, and a gate adapted for connection to the first voltage source; and a first PMOS device having the first threshold voltage associated therewith, the first PMOS device including a source connected to the input of the voltage limiting circuit, a drain connected to the second control input, and a gate adapted for receiving a control signal, the first PMOS device selectively disabling at least a portion of the transmission gate as a function of the control signal.

20. The integrated circuit of claim 12, wherein the input stage in the differential amplifier comprises:

first and second NMOS devices, each of the first and second NMOS devices having the first threshold voltage associated therewith, sources of the first and second NMOS devices being connected to a first node of a bias source, a drain of the first NMOS device being connected to the load at a first node, a drain of the second NMOS device being connected to the load at a second node and forming the output of the differential amplifier, a gate of the first NMOS device forming an inverting input of the differential amplifier and being adapted for receiving the first signal, and a gate of the second NMOS device forming a non-inverting input of the differential amplifier and being adapted for receiving the second input signal;

first and second voltage limiting circuits, the first voltage limiting circuit being operative to receive the first signal and to generate a first clamp signal, the first clamp signal being substantially equal to the first signal when the first signal is less than or equal to a prescribed maximum voltage level and the first clamp signal being substantially equal to the maximum voltage level when the first signal is greater than the maximum voltage level, the second voltage limiting circuit being operative to receive the second signal and to generate a second clamp signal, the second clamp signal being substantially equal to the second signal when the second signal is less than or equal to the maximum voltage level and the second clamp signal being substantially equal to the maximum voltage level when the second signal is greater than the maximum voltage level; and third and fourth NMOS devices, each of the third and fourth NMOS devices having the second threshold voltage associated therewith, sources of the third and fourth NMOS devices being connected to a second node of the bias source, a drain of the third NMOS device being connected to the drain of the first NMOS device, a drain of the fourth NMOS device being connected to the drain of the second NMOS device, a gate of the third NMOS device being connected to the first voltage limiting circuit and being adapted to receive the first clamp signal, and a gate of the fourth NMOS device being connected to the second voltage limiting circuit and being adapted to receive the second clamp signal.

* * * * *